United States Patent
Johnson et al.

(10) Patent No.: US 12,040,594 B2
(45) Date of Patent: Jul. 16, 2024

(54) TUNABLE VCSEL WITH COMBINED GAIN AND DBR MIRROR

(71) Applicant: Excelitas Technologies Corp., Waltham, MA (US)

(72) Inventors: Bartley C. Johnson, North Andover, MA (US); Mark E. Kuznetsov, Lexington, MA (US); Peter S. Whitney, Bedford, MA (US)

(73) Assignee: Excelitas Technologies Corp., Waltham, MA (US)

( * ) Notice: Subject to any disclaimer, the term of this patent is extended or adjusted under 35 U.S.C. 154(b) by 0 days.

(21) Appl. No.: 18/085,005

(22) Filed: Dec. 20, 2022

(65) Prior Publication Data
US 2023/0208107 A1    Jun. 29, 2023

Related U.S. Application Data

(63) Continuation of application No. 16/993,953, filed on Aug. 14, 2020, now abandoned.

(60) Provisional application No. 62/962,367, filed on Jan. 17, 2020, provisional application No. 62/887,332, filed on Aug. 15, 2019.

(51) Int. Cl.
*H01S 5/183* (2006.01)
*H01S 5/04* (2006.01)
*H01S 5/343* (2006.01)

(52) U.S. Cl.
CPC .......... *H01S 5/18366* (2013.01); *H01S 5/041* (2013.01); *H01S 5/18369* (2013.01); *H01S 5/34306* (2013.01)

(58) Field of Classification Search
CPC .. H01S 5/18366; H01S 5/041; H01S 5/18369; H01S 5/34306; H01S 5/18361; H01S 5/18383
See application file for complete search history.

(56) References Cited

U.S. PATENT DOCUMENTS

| | | |
|---|---|---|
| 4,881,236 A | 11/1989 | Brueck et al. |
| 5,052,016 A | 9/1991 | Mahbobzadeh et al. |
| 6,661,830 B1 * | 12/2003 | Reed .................. H01S 5/18386 372/99 |
| 2004/0013154 A1 | 1/2004 | Zheng |

(Continued)

FOREIGN PATENT DOCUMENTS

EP    2 720 328 A2    4/2014

OTHER PUBLICATIONS

International Search Report and Written Opinion for International Application No. PCT/US2020/046413 mailed Nov. 19, 2020.

(Continued)

*Primary Examiner* — Yuanda Zhang
(74) *Attorney, Agent, or Firm* — Wolf, Greenfield & Sacks, P.C.

(57) ABSTRACT

A vertical cavity surface emitting laser (VCSEL) has a shortened overall laser cavity by combining the gain section with a distributed Bragg reflector (DBR). The overall cavity length can be contracted by placing gain structures inside the DBR. This generally applies to a number of semiconductor material systems and wavelength bands, but this scheme is very well suited to the AlGaAs/GaAs material system with strained InGaAs quantum wells as a gain medium, for example.

18 Claims, 9 Drawing Sheets

(56) References Cited

U.S. PATENT DOCUMENTS

| 2007/0036187 | A1 | 2/2007 | Kim et al. | |
|---|---|---|---|---|
| 2014/0133506 | A1* | 5/2014 | Wunderer | H01S 5/1228 372/45.01 |
| 2014/0176958 | A1 | 6/2014 | Flanders et al. | |
| 2016/0329682 | A1 | 11/2016 | Flanders et al. | |
| 2021/0050712 | A1 | 2/2021 | Johnson et al. | |

OTHER PUBLICATIONS

International Preliminary Report on Patentability for International Application No. PCT/US2020/046413 mailed Feb. 8, 2022.
Babic et al., Analytic expressions for the reflection delay, penetration depth, and absorptance of quarter-wave dielectric mirrors. IEEE Journal of Quantum Electronics, 28(2): 514-524 (1992).
Choi et al., Phase-sensitive swept-source optical coherence tomography imaging of the human retina with a vertical cavity surface-emitting laser light source. Optics Letters 38(3): 338-340 (2013).
Fan et al., Tunable High-Power High-Brightness Linearly Polarized Vertical-External-Cavity Surface-Emitting Lasers. Applied Physics Letters, 88(2): 21105-1-21105-3 (2006).
Fujimoto et al., Introduction to optical coherence tomography. Optical coherence tomography: Technology and applications. 2008:1-45.
Hasse et al., Wide Continuous Tuning Range of 221 nm by InP/Air Gap Vertical-Cavity Filters. Electronics Letters, 42(17): 1-2 (2006).
Jayaraman et al., VCSEL swept light sources. Optical Coherence Tomography. 2015:659.
John et al., Wideband electrically pumped 1050-nm MEMS-tunable VCSEL for ophthalmic imaging. J. Lightwave Technology 33(16): 3461-3468 (2015).
Johnson et al., Tunable 1060nm VCSEL co-packaged with pump and SOA for OCT and LiDAR. SPIE Photonics West BiOS Proceedings, 10867 (2019).
Knopp et al., High power MEMs-tunable vertical-cavity surface-emitting lasers. 2001 Digest of LEOS Summer Topical Meetings, TuA1.3:31-32.
Lu et al., Microscope-integrated intraoperative ultrahigh-speed swept-source optical coherence tomography for widefield retinal and anterior segment imaging. Ophthalmic Surgery, Lasers and Imaging Retina, 49(2): 94-102 (2018).
Mahbobzadeh et al., Distributed-feedback vertical-cavity surface-emitting laser with resonant-periodic-gain active region.SPIE, 1634: 564-575 (1992).
Mahbobzadeh et al., Novel Distributed-Feedback Resonant-Periodic-Gain Structure for Vertical-Cavity Surface-Emitting Semiconductor Lasers. Electronics Letters, 26(20): 1716-1718 (1990).
Mahbobzadeh et al., Novel Distributed-Feedback Surface-Emitting Laser Design. Optics Society Annual Meeting Conference Proceedings, 2: 366-367 (1990).
Matsui et al., Complete polarization mode control of long-wavelength tunable vertical-cavity surface-emitting lasers over 65-nm tuning, up to 14-mw output power. IEEE J. Quantum Electronics, 39(9): 1037-1048 (2003).
Orfanidis et al., Multilayer structures. [Electromagnetic Waves and Antennas], ch. 6, 186-240, Self published (2016). https://www.ece.rutgers.edu/-orfanidi/ewa/ch06.pdf.
Schaus et al., MOCVD Growth of GaAs/ AIGaAs Wavelength Resonant Periodic Gain Vertical Cavity Surface-Emitting Laser. Electronics Letters, 25(8): 538-539 (1989).
Wang et al., Cubic meter vol. optical coherence tomography. Optica 3(12):1496-1503 (2016).

* cited by examiner

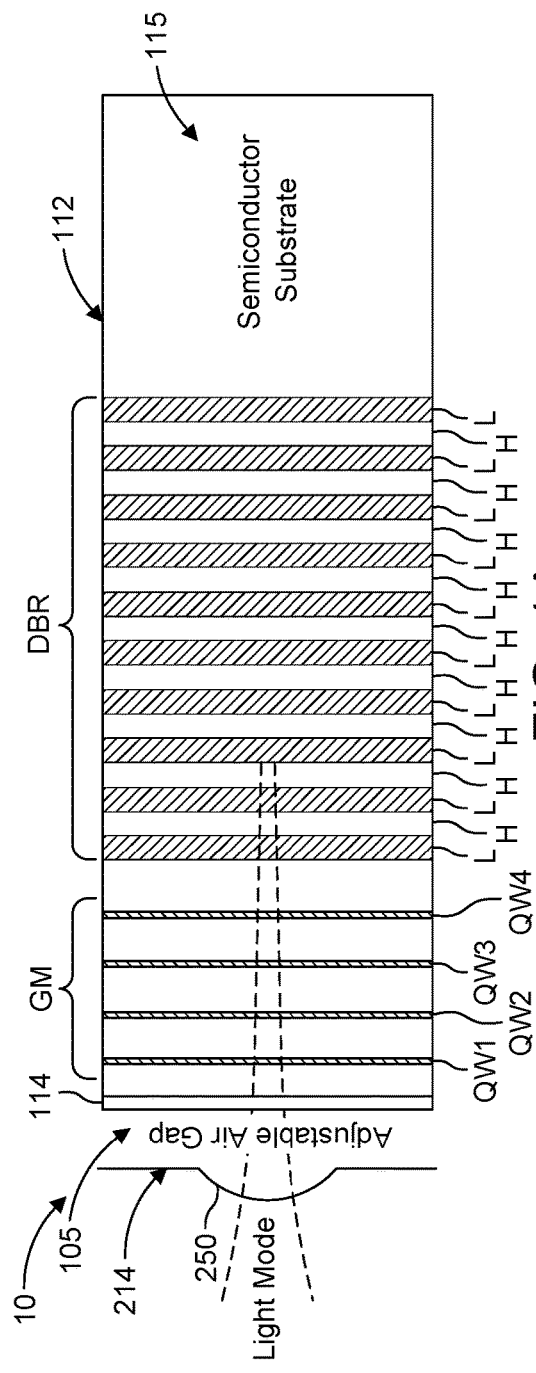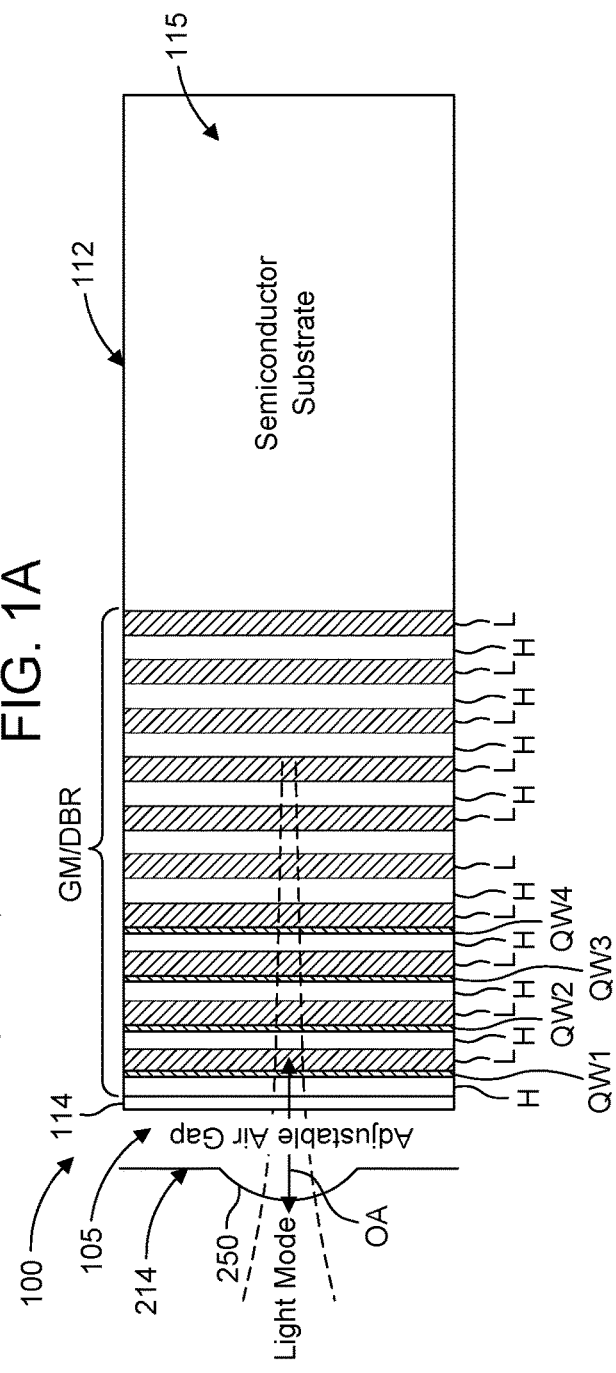

TUNABLE VCSEL WITH COMBINED GAIN AND DBR MIRROR

RELATED APPLICATIONS

This application is a continuation of U.S. patent application Ser. No. 16/993,953, filed on Aug. 14, 2020, titled "TUNABLE VCSEL WITH COMBINED GAIN AND DBR MIRROR," which claims priority to and the benefit under 35 USC 119(e) of U.S. Provisional Application No. 62/887,332, filed on Aug. 15, 2019, titled "TUNABLE VCSEL WITH COMBINED GAIN AND DBR MIRROR." U.S. patent application Ser. No. 16/993,953 also claims priority to and the benefit under 35 USC 119(e) of U.S. Provisional Application No. 62/962,367, filed on Jan. 17, 2020, titled "TUNABLE VCSEL WITH COMBINED GAIN AND DBR MIRROR." The contents of each of the above-listed applications which are is incorporated herein by reference in their entireties.

BACKGROUND OF THE INVENTION

Tunable VCSELs with microelectromechanical (MEMS) movable mirrors have found application in telecommunications, Matsui, Y., Vakhshoori, D., Wang, P., Chen, P., Lu, C.-C., Jiang, M., Knopp, K., Burroughs, S., and Tayebati, P., "Complete polarization mode control of long-wavelength tunable vertical-cavity surface-emitting lasers over 65-nm tuning, up to 14-mw output power," IEEE J. Quantum Electronics 39, 1037-1048 (2003) and Knopp, K., Vakhshoori, D., Wang, P., Azimi, M., Jiang, M., Chen, P., Matsui, Y., McCallion, K., Baliga, A., Sakhitab, F., Letsch, M., Johnson, B., Huang, R., Jean, A., DeLargy, B., Pinzone, C., Fan, F., Liu, J., Lu, C., Zhou, J., Zhu, H., Gurjar, R., Tayebati, P., MacDaniel, D., Baorui, R., Waterson, R., and Van der Rhodes, G., "High power MEMs-tunable vertical-cavity surface-emitting lasers," in [2001 Digest of LEOS Summer Topical Meetings], TuA1.3, 31-32 (2001). They have also found application in optical coherence tomography (OCT). See for example B. Johnson, W. Atia, S. Woo, C. Melendez, M. Kuznetsov, T. Ford, N. Kemp, J. Jabbour, E. Mallon, P. Whitney, "Tunable 1060 nm VCSEL co-packaged with pump and SOA for OCT and LiDAR," SPIE Photonics West BiOS Proceedings, 10867 (2019) and Flanders, D. C., Kuznetsov, M. E., Atia, W. A., and Johnson, B. C., "OCT system with bonded MEMS tunable mirror VCSEL swept source." US Patent application Pub. No. US2016/0329682 A1 (10 Nov. 2016).

To date, most swept source OCT applications occur in the 1310 nanometer (nm) and 1060 nm bands. And, for OCT, it is very important to achieve the widest tuning range in optical frequency since the depth resolution in OCT is inversely proportional to the tuning range. See J. Fujimoto and W. Drexler, "Introduction to Optical Coherence Tomography," in [Optical Coherence Tomography: Technology and Applications, First Edition], Drexler, W. and Fujimoto, J. G., eds., ch. 1, 1-40, Springer (2008).

Two of the most important factors affecting a VCSEL's tuning range are the (1) bandwidths of the laser cavity mirrors and (2) the laser cavity length. Much work has gone into broad-band mirror technology, including high-index-contrast dielectric mirrors and GaAs/oxidized AlAs mirrors. See Jayaraman, V., Jiang, J., Potsaid, B., Robertson, M., Heim, P. J. S., Burgner, C., John, D., Cole, G. D., Grulkowski, I., Fujimoto, J. G., Davis, A. M., and Cable, A. E., "VCSEL swept light sources," in [Optical Coherence Tomography: Technology and Applications, Second Edition], Drexler, W. and Fujimoto, J. G., eds., ch. 22, 659-686, Springer (2015). The GaAs/AlAs material system natively has fairly high index contrast allowing epitaxially-grown mirrors supporting tuning ranges on the order of 100 nm.

The free-spectral range (FSR) of a VCSEL cavity in optical frequency is $c/(2L)$, where c is the speed of light and L is the total length of the laser cavity including the group delay of the mirrors (see D. I. Babic and S. W. Corzine, "Analytic expressions for the reflection delay, penetration depth, and absorptance of quarter-wave dielectric mirrors," IEEE Journal of Quantum Electronics, 28, 514-524, (1992)), the length of the air gap and the length of the gain section and other layers. The laser tuning range is limited by the FSR because another lasing mode can pop up one FSR away as the device is tuned. The spectral gain bandwidth of the active quantum wells also has to be wide enough to allow wide tuning.

A MEMS tunable VCSEL has one mirror on a flexible membrane coupled to a ½-VCSEL structure that combines an optical gain medium with a second, stationary reflector. See Flanders, D. C., Kuznetsov, M. E., Atia, W. A., and Johnson, B. C., "OCT system with bonded MEMS tunable mirror VCSEL swept source." US Patent application 2016/0329682 A1 (10 Nov. 2016) and Jayaraman, V., Jiang, J., Potsaid, B., Robertson, M., Heim, P. J. S., Burgner, C., John, D., Cole, G. D., Grulkowski, I., Fujimoto, J. G., Davis, A. M., and Cable, A. E., "VCSEL swept light sources," in [Optical Coherence Tomography: Technology and Applications, Second Edition], Drexler, W. and Fujimoto, J. G., eds., ch. 22, 659-686, Springer (2015).

SUMMARY OF THE INVENTION

Present invention concerns a way of shortening the overall cavity length by combining the gain section with a distributed Bragg reflector (DBR). The overall cavity length can be contracted by placing gain structures inside the DBR. This generally applies to a number of semiconductor material systems and wavelength bands, but this scheme is very well suited to the AlGaAs/GaAs material system with strained InGaAs quantum wells as a gain medium, for example.

In general, according to one aspect, the invention features a vertical surface emitting laser, comprising a distributed Bragg reflector and quantum wells located in the distributed Bragg reflector.

In embodiments, a deflectable membrane carries a mirror defining an optical cavity.

Typically, the quantum wells are located in shallow layers of the distributed Bragg reflector.

The laser can be fabricated in AlGaAs/GaAs, although other material systems can be used. Also, the quantum wells might be optically pumped or electrically pumped.

Often, the quantum wells are located between high index layers and low index layers of the distributed Bragg reflector.

In other examples, however, the quantum wells are located in high index layers of the distributed Bragg reflector.

Typically, the quantum wells are placed at antinodes of standing wave patterns in the laser.

Further, there might be eight or more quantum wells, especially when high power is desired. Also, the high index layers of the distributed Bragg reflector can be thinner than the low index layers.

In general, according to another aspect, the invention features a vertical surface emitting laser system, comprising a vertical surface emitting laser, including a distributed Bragg reflector and quantum wells located in the distributed Bragg reflector and a pump laser for optically pumping the quantum wells.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 1A shows a conventional arrangement for the DBR mirror and the quantum wells in a MEMS tunable VCSEL 10;

FIG. 1B shows an arrangement for the DBR mirror and the quantum wells QW in a gain embedded DBR VCSEL of the present invention;

DETAILED DESCRIPTION OF THE PREFERRED EMBODIMENTS

Figure 2A:
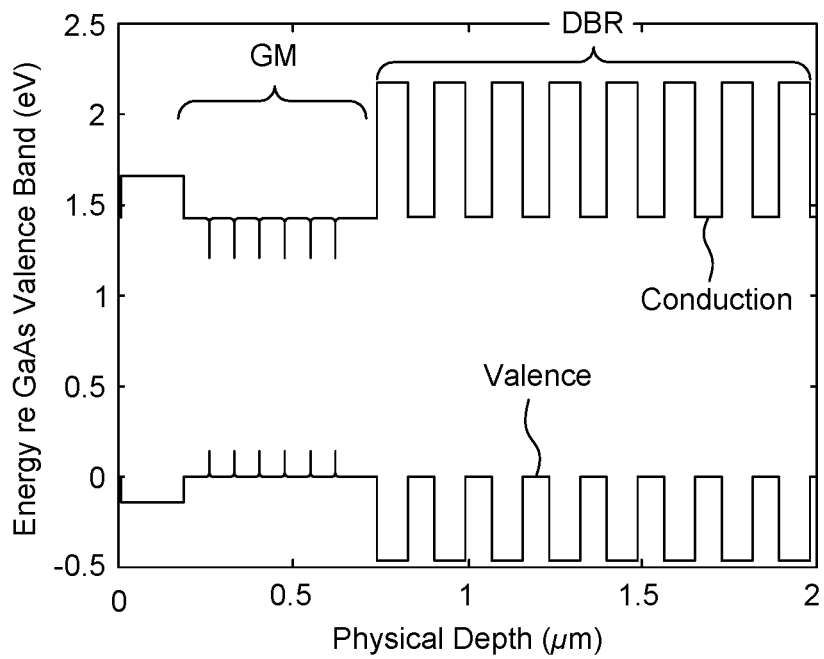
FIGS. 2A, 2B, and 2C are plots of energy of the GaAs valence and conduction bands in electron volts (Ev), wavelength in nanometers (nm) as a function of optical gap in micrometers and gain per well as a function of air optical gap in micrometers for a conventional tunable VCSEL.

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

It will be understood that although terms such as "first" and "second" are used herein to describe various elements, these elements should not be limited by these terms. These terms are only used to distinguish one element from another element. Thus, an element discussed below could be termed a second element, and similarly, a second element may be termed a first element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1A shows a conventional arrangement for the DBR mirror and the quantum wells in a MEMS tunable VCSEL 10.

In more detail, the MEMS tunable VCSEL 10 includes a front MEMS membrane structure 214 that carries a membrane mirror 250. A ½ or half VCSEL chip or device 112 is separated from the front MEMS membrane structure 214 by an adjustable air optical gap 105, the length of which along the optical axis is tuned by deflecting the membrane structure.

The half VCSEL device 112 typically has an antireflective coating 114 facing the air optical gap 105. This is typically a dielectric coating that minimizes reflections at the interface with the air optical gap 105. A gain medium GM of the half VCSEL device 112 typically has multiple quantum well layers QW1, QW2, QW3, QW4. A DBR stack mirror follows the gain medium in the half VCSEL device 112. This mirror DBR is characterized by a stack of alternating layers of high refractive index material H and low refractive index material L. In general, the DBR mirror can have as few as 4 layers to 70 layers or more, depending on the desired reflectivity and the difference in the refractive indices of the two materials used. Finally, the half VCSEL device 112 further includes a substrate 115, on which the various layers are deposited and which provides mechanical support.

It is conventional that the gain medium GM is separate from the DBR mirror in the half VCSEL device 112.

FIG. 1B shows an arrangement for the DBR mirror and the quantum wells QW in a gain embedded DBR VCSEL 100 constructed according to the principles of the present invention.

Here, the overall cavity length is contracted in the direction of the optical axis by placing the gain medium GM inside the DBR stack mirror to create a combined gain medium and DBR mirror GM/DBR.

In general, in the illustrated example, the quantum wells are associated with the portion of the DBR mirror that is closest to the air gap 105 in the half VCSEL device 112. Specifically, after antireflective coating 114, there is low index material layer H, a first quantum well QW1, then a high index material layer L, low index material layer H, a second quantum well QW2, then a high index material layer L, low index material layer H, a third quantum well QW3, then a high index material layer L, low index material layer H, and a fourth quantum well QW4. Then the remaining layers H,L of the DBR mirror are added for the desired reflectivity. As shown, preferably, the quantum wells are added between the high index and low index layers of the DBR mirror.

The quantum well layers QW1-QW4 are preferably placed high in the stack of the DBR mirror where the electrical fields of the reflected light are strongest. This maximizes their respective contributions to the gain.

This combined gain medium and DBR mirror, the GM/DBR, is generally applicable to a number of semiconductor material systems and wavelength bands. Common material systems are based on III-V semiconductor materials, including binary materials, such as GaN, GaAs, InP, GaSb, InAs, as well as ternary, quaternary, and pentenary alloys, such as InGaN, InAlGaN, InGaP, AlGaAs, InGaAs, GaInNAs, GaInNAsSb, AlInGaAs, InGaAsP, AlGaAsSb, AlGaInAsSb, AlAsSb, InGaSb, InAsSb, and InGaAsSb. Collectively, these material systems support operating wavelengths from about 400 nanometers (nm) to 2000 nm, including longer wavelength ranges extending into multiple micrometer wavelengths. Semiconductor quantum well and quantum dot gain regions are typically used to obtain especially wide gain and spectral emission bandwidths. Quantum well layers may be purposely strained or unstrained depending on the exact materials and the desired wavelength coverage.

Nevertheless, the combined gain medium and DBR mirror, the GM/DBR, is very well suited to the AlGaAs/GaAs material system with strained InGaAs quantum wells as a gain medium. This system lases in a band around 1050 nm. In this material system, the high index layers H are GaAs, and the low index layers L are AlAs or similar high Al content AlGaAs alloys.

The combined gain medium and DBR mirror, the GM/DBR, is optically pumped in a current embodiment. The laser emission light and pump light needs to come through the MEMS membrane structure if the substrate is absorptive at the pump wavelength, as it is for a GaAs substrate.

That is not necessarily true for other material systems, however. The VCSEL emission may be configured to come out of the MEMS side, the substrate side, or both. The MEMS mirror 250 is often curved for spatial mode control; but, it does not necessarily have to be so, for example in cases where thermal lensing in the half VCSEL device 112 is strong.

For optically pumped lasers, gain quantum wells have to be placed inside the pump-absorbing low-bandgap Bragg reflector layers. The concept of placing gain section inside the Bragg reflector mirror can also be applied to the electrically pumped semiconductor lasers.

Figure 2D:
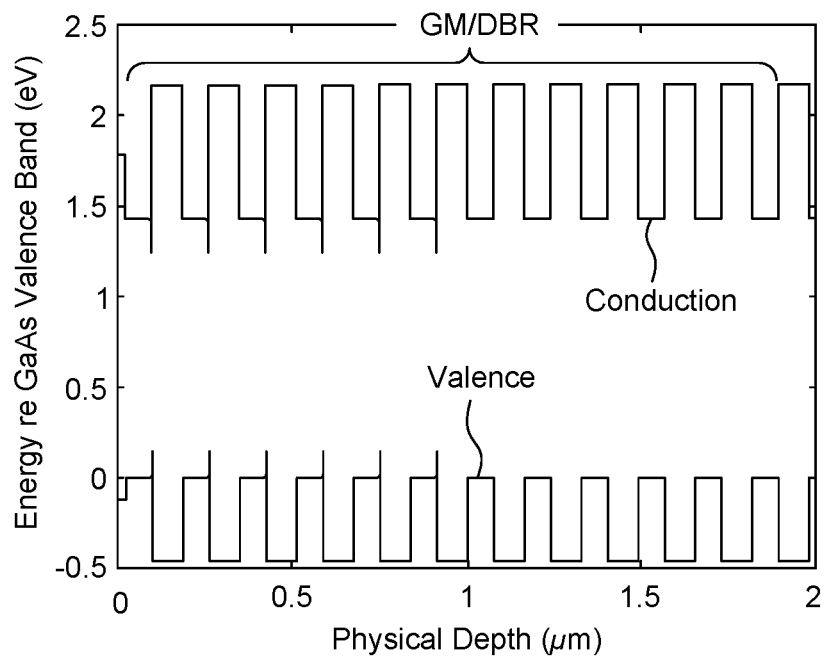
FIGS. 2D, 2E, and 2F are plots of energy of the GaAs valence and conduction bands in electron volts (Ev), wavelength in nanometers (nm) as a function of optical gap in micrometers and gain per well as a function of air optical gap in micrometers for a tunable VCSEL of the present invention.
Figure 2B:
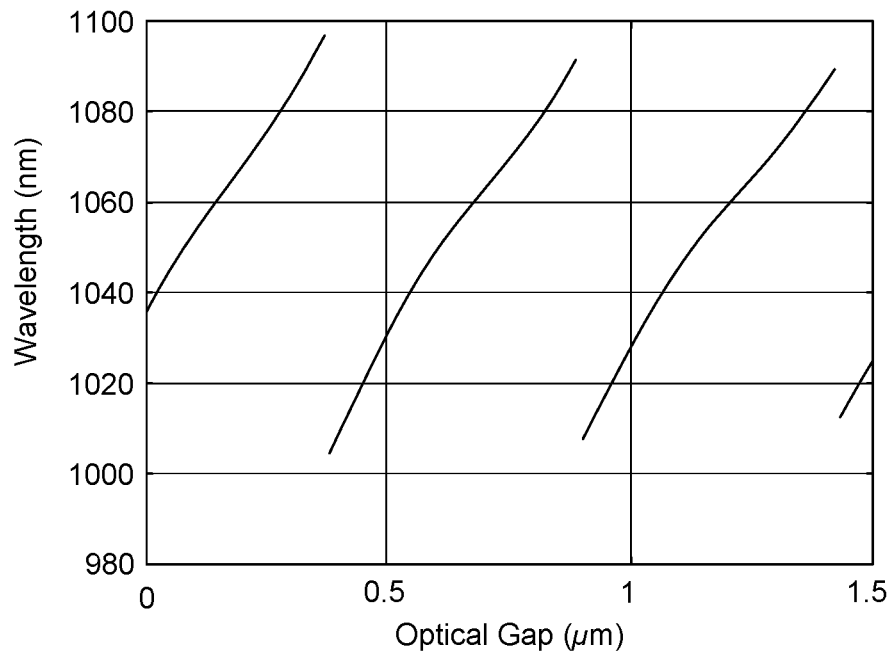
Figure 2E:
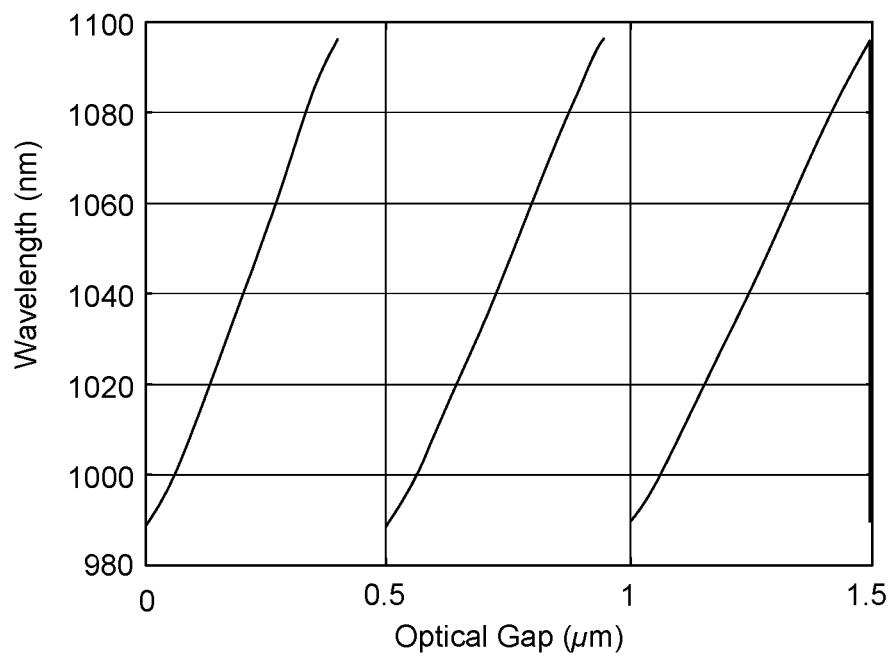
Figure 2C:
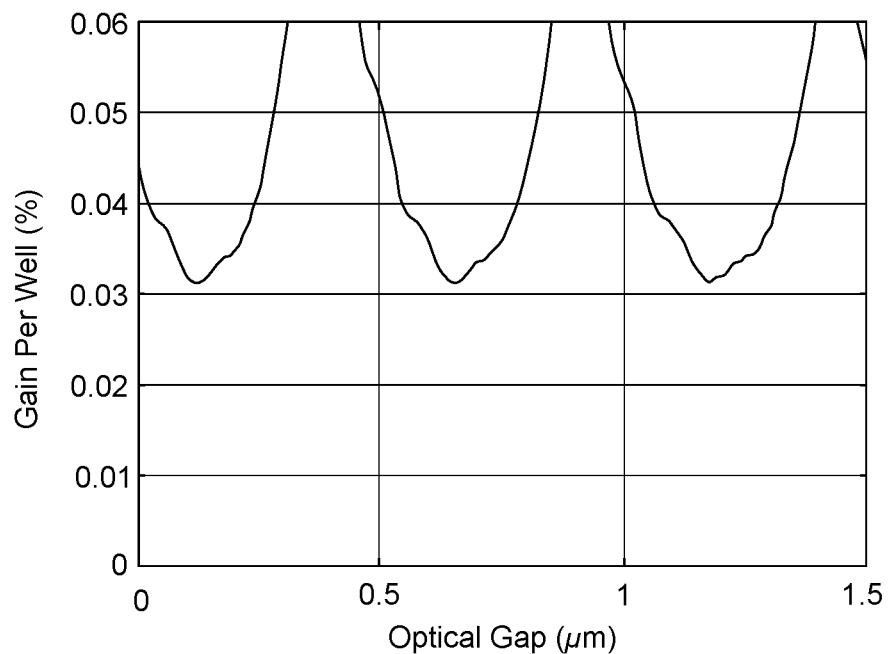

FIGS. 2A, 2B, and 2C are plots of energy of the GaAs valence and conduction bands in electron volts (eV), wavelength in nanometers (nm) as a function of optical gap in micrometers and gain per well as a function of optical gap in micrometers for a conventional tunable VCSEL. The graphs show about 90 nm of tuning range for the VCSEL by changing the optical gap by about 0.5 μm for a six well VCSEL of conventional design.

Figure 2F:
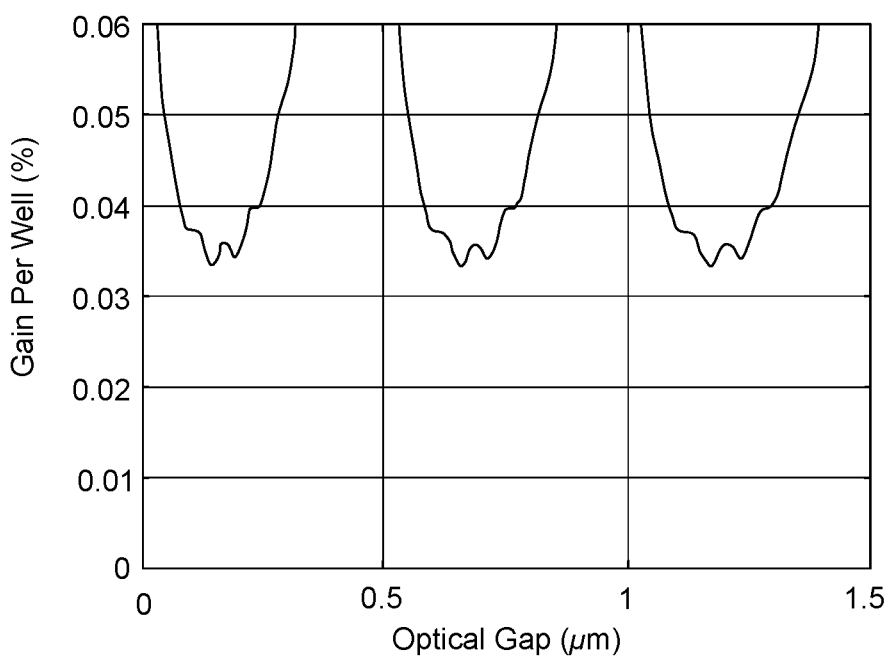

On the other hand, FIGS. 2D, 2E, and 2F are plots of energy of the GaAs valence and conduction bands in electron volts (eV), wavelength in nanometers (nm) as a function of optical gap in micrometers and gain per well as a function of optical gap 105 in micrometers for a tunable VCSEL employing the combined gain medium and DBR mirror GM/DBR. The graphs show about 110 nm of tuning range for the VCSEL by changing the optical gap 105 by less than 0.5 μm. This improved performance is due to the much shorter cavity length afforded by the combined gain medium and DBR mirror GM/DBR.

The two designs have similar threshold gain requirements as seen in FIGS. 2C and 2F. These curves were calculated using an optical multilayer method, see Orfanidis, S. J., "Multilayer structures," n [*Electromagnetic Waves and Antennas*], ch. 6, 186-240, Self published (2016). https://www.ece.rutgers.edu/~orfanidi/ewa/ch06.pdf, using a complex index for the quantum wells to simulate the gain. This allows the threshold gains to be calculated and results in the correct lasing field standing wave locations. The FIGS. 2A and 2D show the conduction and valence band edges for the example where the materials are $GaAs/Al_xGa_{1-x}As/In_yGa_{1-y}As$.

Figure 3:
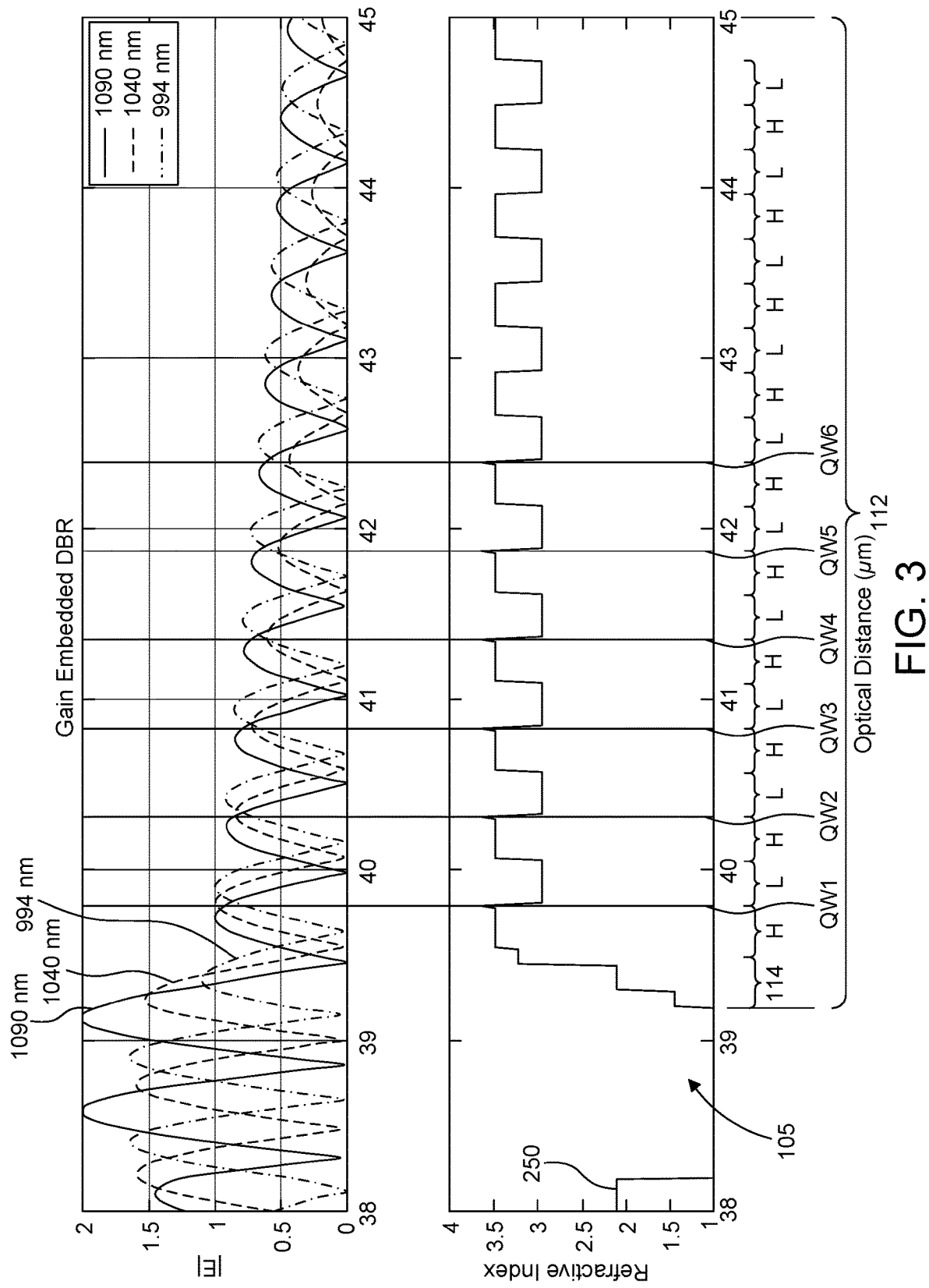
FIG. 3 shows magnitude of the electrical field inside a gain embedded DBR VCSEL 100 along with the refractive index along the device's optical axis OA as a function of optical distance in micrometers.

FIG. 3 shows standing wave patterns (magnitude of the electric field plotted) inside the gain embedded DBR VCSEL 100 with six quantum wells QW1-QW6. The electric field is shown at the band center 1040 nm, short band edge 994 nm, and long band edge 1090 nm. The refractive index profile of the semiconductor and dielectric materials show the structure of the DBR and placement of the quantum wells. The wells QW1-QW6 are placed, and roughly aligned with the antinodes in the DBR of the standing wave patterns for all wavelengths.

Another advantage of the combined gain medium and DBR mirror GM/DBR is that if more gain is required, more quantum wells can be added without appreciably changing the tuning range. In the AlGaAs/GaAs system, pump absorption is weak enough that wells further away from the pump laser are still pumped appreciably.

In fact, the present approach can additionally be used to fabricate high-power tunable VCSELs.

Since there is no tunability penalty for adding quantum wells and absorption material, many more wells could be added beyond the four and six wells shown, such as greater eight wells and even more than ten wells. More wells yield more power. The absorption of the pump wavelength in the GaAs is low enough that power will get to the deeper wells.

Figure 4:
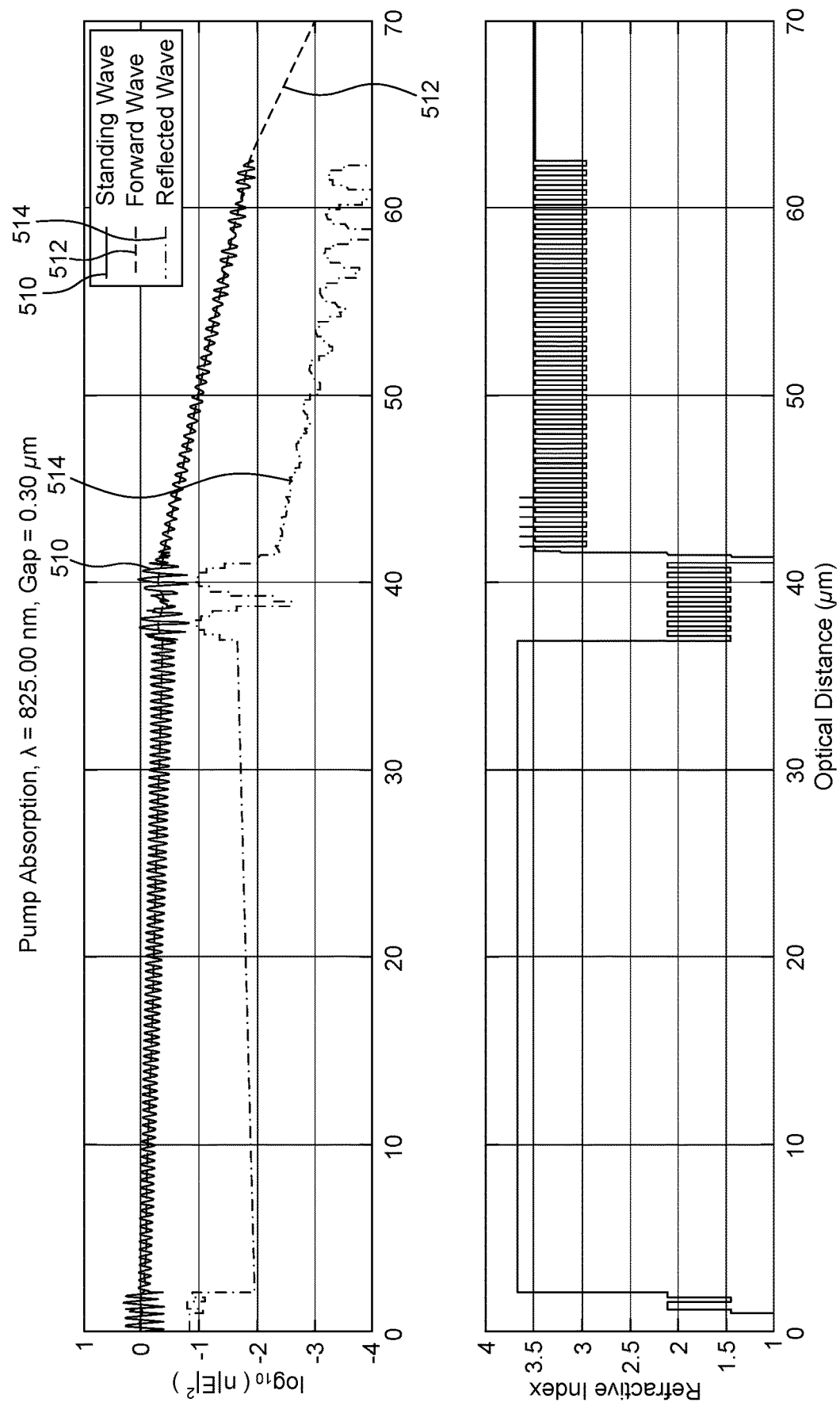
FIG. 4 shows magnitude of the electrical field inside a gain embedded DBR VCSEL 100 as a function of optical distance in micrometers for the pump light at 825 nm showing the standing wave, forward wave, and reflected wave along with the refractive index along the device's optical axis OA.

FIG. 4 shows standing wave patterns (magnitude of the electric field plotted) inside the gain embedded DBR VCSEL 100 for the pump light at 825 nm. As shown, there is enough pump light to power deeper wells.

Pump Absorption

This gain embedded DBR structure is compatible with optical pumping. Absorption into the first few GaAs layers of the DBR channel electron-hole pairs into the co-located strained quantum well layers. The reflected waves are small, and the overall absorption constant is about half that of bulk GaAs since half of the material in the DBR is non-absorbing AlGaAs. The propagating optical power density is calculated from the Poynting vector, and is proportional to $n|E|^2$, where n is the refractive index. The incident forward wave in air from the left is normalized to a value of $n|E|^2=1$. The light absorbed in the gain region is about 12% in this example. The forward and backward waves are plotted, along with the standing wave.

This plot, however, only considers linear absorption. In the case where there is saturated pump absorption in the quantum wells and quantum well barrier layers, deeper wells would be even more advantageous. Depositing more pump power inside the VCSEL cavity naturally provides more VCSEL emission power, assuming the absorbed pump power is channeled into a quantum well that can increase VCSEL emission. The other advantage is that more quantum wells would provide more gain. This would allow the output coupling to be increased by reducing the reflectivity of the output mirror. More output coupling increases the VCSEL's slope efficiency and will further yield more power, depending on the internal losses of the cavity.

In some examples, the power would be high enough to use the VCSEL light directly, without requiring a separate amplification stage, e.g., semiconductor optical amplifier (SOA).

Placement of Quantum Wells in the Gain Embedded DBR Structure

For efficient extraction of gain from a VCSEL structure, the quantum wells QW need to be placed in a region of high optical field, preferably at an antinode of the VCSEL's standing wave pattern. For example, in a GaAs/$Al_{0.97}Ga_{0.03}As$ DBR, the strained InGaAs quantum well is placed near the junction of the GaAs and $Al_{0.97}Ga_{0.03}As$, which is where the antinode is, as shown in FIG. 3. The GaAs also serves as an absorbing region where pump light is absorbed, and the excited electrons and holes are funneled into the potential well formed by the strained InGaAs quantum wells. As drawn, the GaAs and $Al_{0.97}Ga_{0.03}As$ regions have equal optical lengths to maximize the reflectivity of the DBR. However, thicker GaAs could be grown with thinner $Al_{0.97}Ga_{0.03}As$ in order to keep the DBR period the same. This would have the effect of increasing optical absorption while decreasing the DBR reflectivity and bandwidth. This might be a favorable tradeoff in some cases. It may also be preferable to offset the quantum wells slightly from the GaAs/$Al_{0.97}Ga_{0.03}As$ interfaces so that the quantum well barrier is GaAs on both sides. The quantum well should not be placed at the left edge or in the center of the GaAs sections of the DBR since this is at or close to the nodes of the standing wave patterns at many wavelengths.

Hybrid Structures

Hybrid structures can be employed that are intermediate between a separate gain region structure and a gain embedded DBR structure. One way this can be done is by increasing the GaAs thickness near the quantum wells and decreasing the AlGaAs thickness to keep the same DBR period.

Figure 5A:
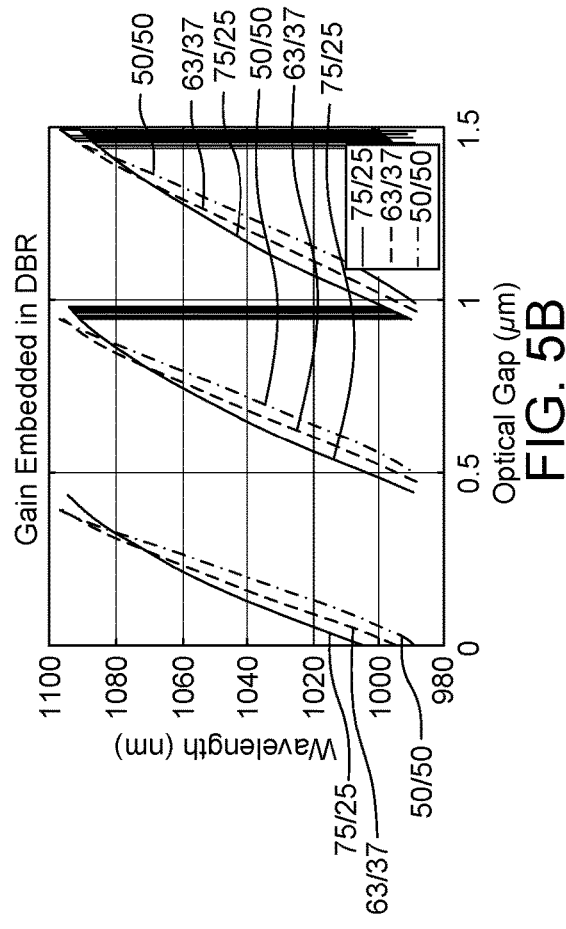
FIG. 5A is a plot of energy in the GaAs valence and conduction bands in electron Voltage (eV)

FIG. 5A shows a structure of this type, showing the energy in the valence and conduction bands in electron Voltage (eV) in the combined gain medium and DBR mirror GM/DBR. Here, the quantum wells QW1-QW6 are located within respective high refractive index layers H, and the low refractive index layers have a reduced thickness. Yet, the optical period corresponds to roughly half a wavelength.

Figure 5B:
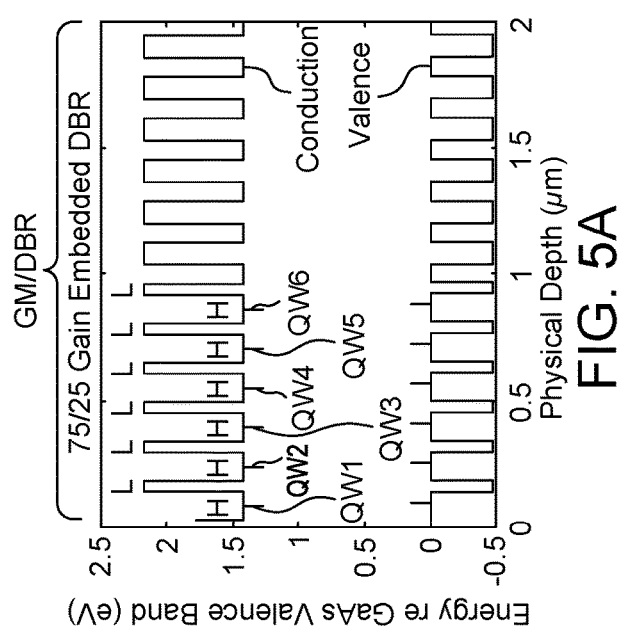
FIGS. 5B and 5C are plots of wavelength nanometers and gain per well as a function of the optical air gap.
Figure 5C:
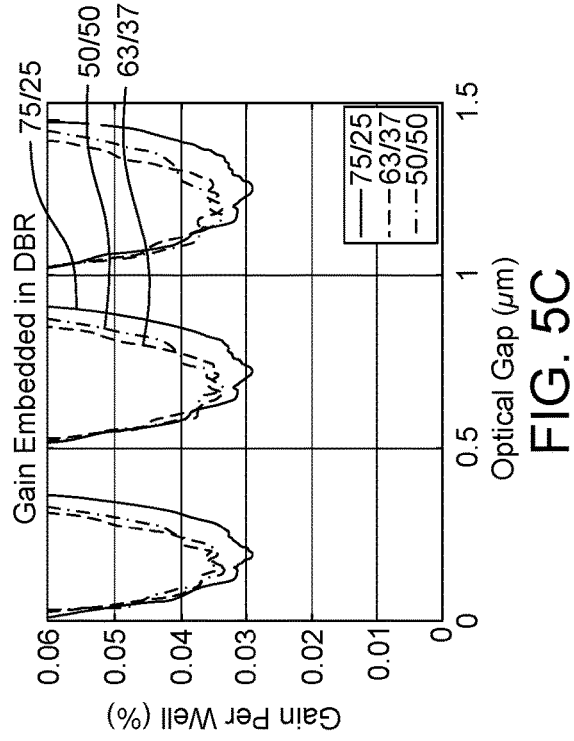

FIGS. 5B and 5C are plots of wavelength nanometers and gain per well as a function of the optical air gap. Calculations for three of these structures are shown where the GaAs/AlGaAs DBR period optical thicknesses are 50/50, 63/37, and 75/25 in percent thickness. Adding GaAs is advantageous since it funnels more pump light into excitation of the quantum wells.

Another variant could place some wells inside the DBR and some outside. A 100/0 thickness variant would be considered a well "outside" the DBR.

EXEMPLARY EMBODIMENT

Figure 6A:
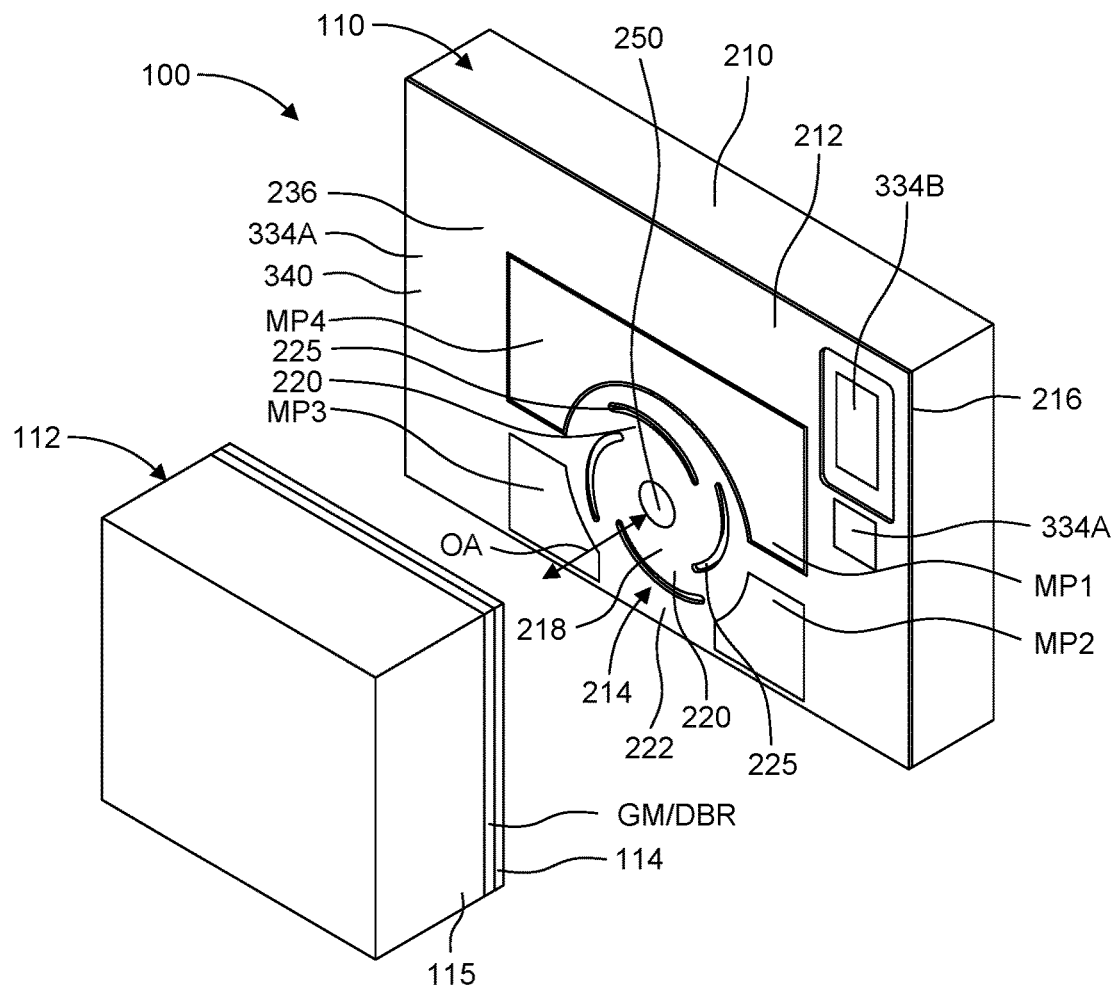
FIGS. 6A and 6B are an exploded perspective view of a wafer- or die-bonded tunable VCSEL and a schematic perspective view of the half VCSEL showing the locations of the bond pads, respectively, to which the present invention could be applied, in one example.
Figure 6B:
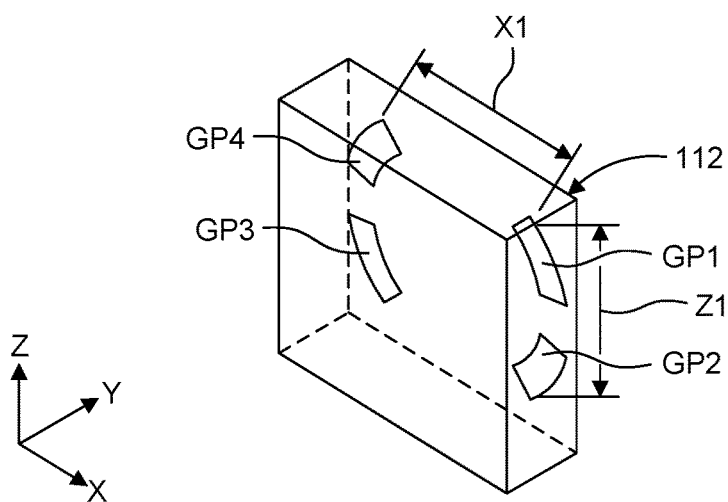

A specific design for a MEMS tunable VCSEL 100 is presented in FIGS. 6A and 6B that employs the combined gain medium and DBR mirror, the GM/DBR. While many designs are possible, this one is formed by bonding the half VCSEL chip or device 112 to a silicon MEMS optical membrane device 110, which has an electrostatically movable mirror for wavelength tuning.

In more detail, the optical membrane device 110 comprises handle wafer material 210 that functions as a support. Currently, the handle is made from doped silicon, with a resistivity <0.1 ohm-cm, carrier concentration >$1 \times 10^{17}$ $cm^{-3}$, to facilitate electrical contact.

An optical membrane or device layer 212 is added to the handle wafer material 210. Typically, silicon on insulator (SOI) wafers are used. An optical membrane structure 214 is formed in this optical membrane layer 212. In the current implementation, the membrane layer 212 is silicon that is low doped with resistivity >1 ohm-cm, carrier concentration <$5 \times 10^{15}$ $cm^{-3}$, to minimize free carrier absorption of the transmitted light. For electrical contact, the membrane layer surface is usually additionally doped by ion implantation to create a highly doped surface layer (doped usually to >$1 \times 10^{18}$ $cm^{-3}$, but at least $1 \times 10^{17}$ $cm^{-3}$ and at least 200 Angstroms (Å) thick, usually 500-2000 Å thick). This method minimizes optical absorption in the membrane layer itself that would occur if the entire layer were highly doped. An insulating (buried silicon dioxide) layer 216 separates the optical membrane layer 212 from the handle wafer material 210.

During manufacture of the membrane device in the SOI wafer material, the insulating layer 216 functions as a sacrificial/release layer, which is partially removed to release the membrane structure 214 from the handle wafer material 210. Then during operation, the remaining portions of the insulating layer 216 provide electrical isolation between the patterned device layer 212 and the handle material 210.

In the current embodiment, the membrane structure 214 comprises a body portion 218. The optical axis of the device 100 passes concentrically through this body portion 218 and orthogonal to a plane defined by the membrane layer 212. A diameter of this body portion 218 is preferably 300 to 600 micrometers; currently it is about 500 micrometers.

Tethers 220 (four tethers in the illustrated example) are defined and delineated by arcuate slots 225 fabricated into the device layer 212. The tethers 220 extend radially from the body portion 218 to an outer portion 222, which comprises the ring where the tethers 220 terminate. In the current embodiment, a spiral tether pattern is used.

A membrane mirror dot 250 is disposed on body portion 218 of the membrane structure 214. In some embodiments, the membrane mirror 250 is optically curved to form an optically concave optical element to thereby form a curved mirror laser cavity. In other cases, the membrane mirror 250 is a flat mirror, or even possibly convex.

When a curved membrane mirror 250 is desired, this curvature can be created by forming a depression in the body portion 218 and then depositing the material layer or layers that form mirror 250 over that depression. In other examples, the membrane mirror 250 can be deposited with a high amount of compressive material stress that will result in its curvature.

The membrane mirror dot 250 is preferably a reflecting dielectric mirror stack. In some examples, it is a dichroic mirror-filter that provides a defined reflectivity, such as between 1 and 99.9%, to the wavelengths of laser light generated in the laser 100, whereas the optical dot 250 is transmissive to wavelengths of light that are used to optically pump the active region in the VCSEL device 112. In still other examples, the optical dot is a reflective metal layer such as aluminum or gold.

In the illustrated embodiment, four metal pads MP1, MP2, MP3, and MP4 are deposited on the proximal side of the membrane device 110. These are used to solder or thermocompression bond, for example, the half VCSEL device 112 onto the proximal face of the membrane device 110.

Also provided are two wire bondpads 334A, 334B. Membrane wire bond pad 334A is used to provide an electrical connection to the membrane layer 212 and thus the membrane structure 214. The handle wire bond pad 334B is used to provide an electrical connection to the handle wafer material 210.

The half VCSEL device 112 generally comprises an antireflective coating 114, which is optional, and the combined gain medium and DBR mirror GM/DBR. The cap layer can be used between the antireflective coating 114, if present, and the combined gain medium and DBR mirror GM/DBR. The cap layer protects the active region from the surface/interface effects at the interface to the AR coating and/or air.

In still other examples, the combined gain medium and DBR mirror GM/DBR is a dichroic mirror-filter that provides a defined reflectivity, such as greater than 99% to the wavelengths of laser light generated in the laser 100, whereas the GM/DBR is transmissive to wavelengths of light that are used to optically pump the active region in the VCSEL device 112, thus allowing the half VCSEL device 112 to function as an input port of pump light.

In the example of a VCSEL operating with a center wavelength around 1050 nm, the mirror reflectivities tend toward higher numbers for light around 1050 nm in wavelength. For example, the reflectivity of the GM/DBR is about 99.99%. On the other hand, the front mirror dot 250 is usually 99% or greater. In current embodiments, the mirror dot 250 has a reflectivity of about 99.4% or higher.

In operation, the VCSEL device is electrically or optically pumped. The generated light resonates between the combined gain medium and DBR mirror GM/DBR and membrane mirror 250. The wavelength of the generated light is tuned within the scan band of the device by the out of plane electrostatic deflection of the body portion 218 and thus the membrane mirror 250 by controlling the electrostatic field between the body portion 218 and the handle wafer material 210 and/or the half VCSEL device 112.

FIG. 6B is schematic view showing the hidden bond pads VP1-VP4 on the half VCSEL device 112.

The thin gold pads VP1-VP4 on the ½ VCSEL device 112 are thermocompression bonded to corresponding membrane pads MP1, MP2, MP3, and MP4 of the MEMS membrane (mirror) device 110 by placing them in contact at high pressure and temperature to form the bond. Typically, this is done at 300-360° C. and 1-10N force. Other elevated temperature bonding methods, such as gold-tin and/or eutectic soldering, can be used to produce a similar effect, however.

In some examples, when the bonded structure cools, strain is introduced because of the different coefficients of thermal expansion (CTE) between the silicon MEMS membrane device 110 and the substrate material used for the optical gain medium of the half VCSEL device 112. An asymmetric bond pad arrangement is used to produce asymmetric stress. Specifically, the bond pad arrangement is asymmetric in that the x-axis distance (X1) between the pads is greater than the z-axis distance (Z1) between the pads. Said another way, a distance between the bond pads is different between two axes of a plane of the membrane device and the half VCSEL device. The bond pad asymmetry is designed so that the added stress asymmetry to the ½ VCSEL from bonding to the membrane device 112 is between 20 and 100 MPa.

More details of the design and other designs can be found in US Patent Application Pub. No. US 2014/0176958 A1, filed on 21 Dec. 2012, which is incorporated herein by this reference.

Figure 7:
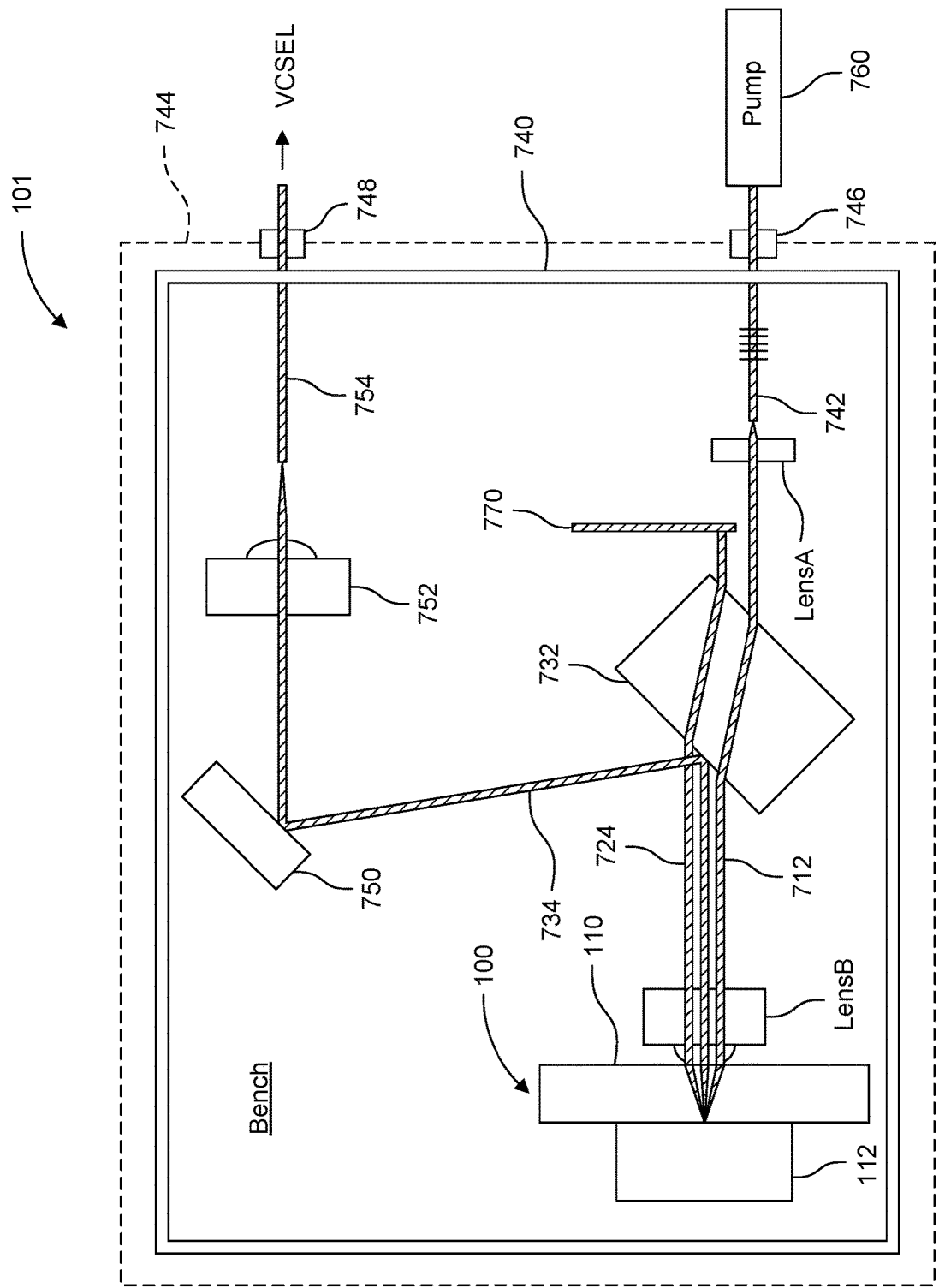
FIG. 7 is a top plan view of an optically pumped tunable VCSEL swept source module including the gain embedded DBR VCSEL.

FIG. 7 also shows an example optically pumped tunable VCSEL swept source system 101 employing the gain embedded DBR VCSEL 100, which system has been integrated into a single module.

Light from a pump chip 760 is coupled to a bench 740 via a pump optical fiber 742. The pump light 712 from the optical fiber 742 is collimated by a first lens LensA that is affixed to the bench 740. The pump light 712 then is transmitted through the dichroic mirror 732 and then focused by a second lens LensB onto the half VCSEL 112 of the VCSEL 100.

Preferably, the bench 740, in turn, is installed in a hermetic package 744 with optical fibers passing through fiber-feedthroughs 746, 748 of the package 744.

The dichroic mirror 732 is reflective to longer wavelength of the VCSEL light 734, emitted by the VCSEL 100, but transmissive to the pump light 712, 724 in the illustrated example. Specifically in the illustrated example, the tunable signal from the VCSEL 100 is reflected by the dichroic mirror 732, which is affixed to the bench 740, and directed to a fold mirror 750 which is also affixed to the bench 740 and then to a third lens 752, which is affixed to the bench 740. The third lens 752 focuses light into an entrance aperture of an output optical fiber 754.

More details of this specific design can be found in U.S. Pat. Appl. Pub. No. US 2019/0348813 A1, which is incorporated herein by this reference in its entirety.

While this invention has been particularly shown and described with references to preferred embodiments thereof, it will be understood by those skilled in the art that various changes in form and details may be made therein without departing from the scope of the invention encompassed by the appended claims.

What is claimed is:

1. A vertical surface emitting laser, comprising:
    a distributed Bragg reflector mirror, comprising a plurality of high/low refractive index layer pairs;
    a deflectable membrane carrying a second mirror defining an optical cavity of the vertical surface emitting laser, wherein the deflectable membrane is configured to tune the vertical surface emitting laser emission across a plurality of wavelengths; and
    quantum wells located in the distributed Bragg reflector, wherein the quantum wells are positioned to overlap with antinodes of the plurality of wavelengths, wherein at least one quantum well is located inside a high refractive index layer of the plurality of high/low refractive index layer pairs such that the at least one quantum well has a high refractive index barrier on each side of the at least one quantum well, and wherein the high refractive index layer has an optical thickness larger than one quarter wavelength and less than one half wavelength at the center wavelength of the distributed Bragg reflector.

2. The laser of claim 1, wherein the quantum wells are located in shallow layers of the distributed Bragg reflector.

3. The laser of claim 1, wherein the quantum wells located inside the distributed Bragg reflector are fabricated in AlGaAs/GaAs materials.

4. The laser of claim 1, wherein the quantum wells are located between high index layers and low index layers of the distributed Bragg reflector.

5. The laser of claim 1, wherein the quantum wells comprise eight four or more quantum wells.

6. The laser of claim 1, wherein the quantum wells of the vertical surface emitting laser are configured to be optically pumped.

7. The vertical surface emitting laser of claim 1, wherein the at least one quantum well is located inside a high refractive index layer of the plurality of high/low refractive index layer pairs such that the at least one quantum well has a high refractive index barrier on each side of the at least one quantum well, and wherein the pairs have a combined optical thickness of half a wavelength at a center wavelength of the distributed Bragg reflector.

8. The vertical surface emitting laser of claim 1, wherein the deflectable membrane is configured to tune the vertical surface emitting laser emission across the plurality of wavelengths by out of plane electrostatic deflection of the deflectable membrane.

9. The vertical surface emitting laser of claim 1, where a center wavelength is between 1.0-1.35 μm.

10. The vertical surface emitting laser of claim 1, wherein a pair of high/low refractive index layers, having a combined thickness of half a wavelength at a center wavelength of the distributed Bragg reflector, comprises high/low layers having optical thicknesses of 63/37 percent, respectively.

11. The vertical surface emitting laser of claim 1, wherein a pair of high/low refractive index layers, having a combined thickness of half a wavelength at a center wavelength of the distributed Bragg reflector, comprises high/low layers having optical thicknesses of 75/25 percent, respectively.

12. A vertical surface emitting laser system, comprising:
a vertical surface emitting laser, comprising:
  a distributed Bragg reflector mirror comprising:
    a plurality of high/low refractive index layer pairs, wherein the pairs have a combined optical thickness of half a wavelength at a center wavelength of the distributed Bragg reflector; and
    at least one quantum well located inside a high refractive index layer of the plurality of high/low refractive index layer pairs such that the at least one quantum well has a high refractive index barrier on each side of the at least one quantum well, and wherein the high refractive index layer has an optical thickness larger than one quarter wavelength at the center wavelength of the distributed Bragg reflector;
  a deflectable membrane carrying a mirror defining an optical cavity of the vertical surface emitting laser, wherein the deflectable membrane is configured to tune the vertical surface emitting laser emission across a plurality of wavelengths; and
  a pump laser for optically pumping the at least one quantum well.

13. The system of claim 12, wherein the at least one quantum well is located in the distributed Bragg reflector which is fabricated in AlGaAs/GaAs materials.

14. The vertical surface emitting laser system of claim 12, where the center wavelength is between 1.0-1.35 μm.

15. The vertical surface emitting laser system of claim 12, wherein the at least one quantum well is positioned to overlap with antinodes of the plurality of wavelengths.

16. The vertical surface emitting laser system of claim 12, wherein the at least one quantum well is located in shallow layers of the distributed Bragg reflector.

17. The vertical surface emitting laser system of claim 12, wherein a pair of high/low refractive index layers comprises high/low layers having optical thicknesses of 63/37 percent, respectively.

18. The vertical surface emitting laser system of claim 12, wherein a pair of high/low refractive index layers comprises high/low layers having optical thicknesses of 75/25 percent, respectively.

* * * * *